(12) United States Patent
Kirstine (10) Patent No.: US 9,144,149 B2
(45) Date of Patent: Sep. 22, 2015

(54) HEAT-DISSIPATING ASSEMBLIES AND METHODS OF ASSEMBLING HEAT-DISSIPATING ASSEMBLIES

(71) Applicant: Micron Technology, Inc., Boise, ID (US)

(72) Inventor: Rodney L. Kirstine, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 273 days.

(21) Appl. No.: 13/875,431

(22) Filed: May 2, 2013

(65) Prior Publication Data

US 2013/0242507 A1   Sep. 19, 2013

Related U.S. Application Data

(63) Continuation of application No. 12/958,974, filed on Dec. 2, 2010, now Pat. No. 8,467,191.

(51) Int. Cl.
*H05K 7/20* (2006.01)
*H05K 1/02* (2006.01)
*H05K 13/00* (2006.01)

(52) U.S. Cl.
CPC ............ *H05K 1/021* (2013.01); *H05K 7/20509* (2013.01); *H05K 13/00* (2013.01); *Y10T 29/49117* (2015.01)

(58) Field of Classification Search
CPC combination set(s) only.
See application file for complete search history.

(56) References Cited

U.S. PATENT DOCUMENTS

| | | | |
|---|---|---|---|
| 4,344,106 A * | 8/1982 | West et al. | ..................... 361/717 |
| 4,387,413 A * | 6/1983 | Griffis | ........................... 361/717 |
| 4,612,601 A | 9/1986 | Watari | |
| 4,765,400 A | 8/1988 | Chu et al. | |
| 4,879,629 A | 11/1989 | Tustaniwskyj et al. | |
| 4,933,808 A | 6/1990 | Horton et al. | |
| 5,109,320 A | 4/1992 | Bourdelaise et al. | |
| 5,285,350 A | 2/1994 | Villaume | |
| 5,623,394 A | 4/1997 | Sherif et al. | |
| 5,653,280 A | 8/1997 | Porter | |
| 5,757,621 A | 5/1998 | Patel | |
| 6,046,498 A | 4/2000 | Yoshikawa | |
| 6,084,178 A | 7/2000 | Cromwell | |
| 6,088,226 A | 7/2000 | Rearick | |
| 6,205,026 B1 | 3/2001 | Wong et al. | |
| 6,252,774 B1 | 6/2001 | Rife | |
| 6,367,541 B2 | 4/2002 | McCullough | |

(Continued)

*Primary Examiner* — Gregory Thompson
(74) *Attorney, Agent, or Firm* — TraskBritt (57) ABSTRACT

Heat-dissipating assemblies may comprise mounting tabs attached to heat-generating electrical components at a first surface of each mounting tab. An opposing second surface of each mounting tab may be at least substantially coplanar with the second surfaces of the other mounting tabs. A heat sink element may be attached to the second surfaces of at least some of the mounting tabs. Methods of assembling heat-dissipating assemblies may comprise attaching first surfaces of mounting tabs to at least substantially planar assembly surfaces of an assembly fixture such that the first surfaces of the mounting tabs are at least substantially coplanar with one another. Opposing second surfaces of the mounting tabs may be attached to heat-generating electrical components. The assembly fixture may be removed. A heat sink element may be attached to the at least substantially coplanar first surfaces of at least some of the mounting tabs.

20 Claims, 5 Drawing Sheets

(56) References Cited

U.S. PATENT DOCUMENTS

| | | |
|---|---|---|
| 6,377,463 B1 | 4/2002 | Shah |
| 6,661,661 B2 | 12/2003 | Gaynes et al. |
| 6,950,310 B2 | 9/2005 | Edwards |
| 6,982,877 B2 | 1/2006 | Vinson et al. |
| 7,307,845 B2 | 12/2007 | Mayer |
| 7,515,424 B2 | 4/2009 | Deng et al. |
| 2010/0230805 A1 | 9/2010 | Refai-Ahmed |
| 2012/0140421 A1 | 6/2012 | Kirstine |

* cited by examiner

HEAT-DISSIPATING ASSEMBLIES AND METHODS OF ASSEMBLING HEAT-DISSIPATING ASSEMBLIES

CROSS-REFERENCE TO RELATED APPLICATION

This application is a continuation of U.S. patent application Ser. No. 12/958,974, filed Dec. 2, 2010, now U.S. Pat. No. 8,467,191, issued Jun. 18, 2013, for "ASSEMBLIES INCLUDING HEAT SINK ELEMENTS AND METHODS OF ASSEMBLING," the disclosure of which is incorporated herein in its entirety by this reference.

TECHNICAL FIELD

Embodiments of the present invention relate to assemblies including heat sink elements and to methods of assembling. More specifically, various embodiments relate to enabling use of a single heat sink element to provide cooling multiple heat-generating components provided on a substrate.

BACKGROUND

Cooling heat-generating components, such as integrated circuit devices, is often desirable to ensure their proper operation and to extend their useful life. A trend in contemporary circuit design is to provide multiple heat-generating components on a printed circuit board. A consequence of providing multiple heat-generating components on a printed circuit board, which may include integrated circuit devices operating at relatively high speeds, is substantial heat production that may be detrimental to the operation and life of those components. Conventionally, heat sinks are used to transfer heat from the heat-generating components to an area where the heat can be dissipated, such as the atmosphere. Alternatively, or in addition, adequate forced ventilation is provided to remove the heat from the heat sink.

Some conventional approaches to thermal management of packaged electronic devices require the mating of individual heat sinks with individual components. The use of individual heat sinks can be expensive and the associated installation may be labor intensive. Further, as more heat-generating components are provided onto ever-smaller printed circuit boards, each heat sink must be accurately aligned with its neighbor to ensure proper function.

Other conventional heat sinks are also adapted for cooling a multiplicity of heat-generating components. Variations in the manufacturing and assembly processes, however, frequently result in seemingly identical components that have top attachment surfaces, over which the heat sink is provided, at slightly different heights. Possible sources of height differences include, for example, variances in the size of solder balls used to attach components to a substrate, variances in bends of leads used for component attachment, variances in thickness of solder connections, and dimensional variances in other attachment features used for this purpose. Moreover, different components having top attachment surfaces located at different heights may often be provided on the same printed circuit board. In a conventional configuration resulting in different component height, highly compressible thermally conductive gap pads or gap filler materials may be used to fill gaps between the bottom of the heat sink and the top surfaces of the components to be cooled, enabling effective thermal transfer to the heat sink from the shorter components. Gap pads may be attached between the heat sink and the components by thermally conductive epoxy or by mechanical means, such as clamps or fasteners. Alternatively, the heat sink may be configured to deform in response to an applied downward force to contact the top surfaces of components and be attached thereto. Further, gap filler material, such as a thermal interface material (TIM), may also be provided to fill gaps between the heat sink and the components. Conventionally, TIMs are able only to fill relatively thin gaps because a thicker layer of TIM may not provide adequate heat dissipation. Any of these configurations, however, may result in inadequate heat transfer from components due to suboptimal, or failed, thermal attachments or may introduce unacceptable stress on thicker components having top surfaces most out of plane with the top surfaces of the remainder of the components.

DETAILED DESCRIPTION

In the following detailed description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and configurational changes may be made without departing from the scope of the invention. The illustrations presented herein are not meant to be actual views of any particular heat sink, assembly fixture, or heat-generating components, but are merely idealized representations that are employed to describe embodiments of the present disclosure. The drawings presented herein are not necessarily drawn to scale. Additionally, elements common between drawings may retain the same numerical designation.

As used herein, the term "attachment feature" means and includes affixers, adherers, assemblers, bolts, bonds, buttons, carriers, cinches, clamps, clasps, clenchers, clinches, clips, connectors, contacts, couplers, epoxy, fasteners, fitters, fixers, glue, hangers, harnesses, interconnects, joiners, latches, leads, links, mounts, nails, paste, pegs, pins, reaffixers, reattachments, refasteners, refixers, resecurers, rivets, rods, screws, securers, staples, sticks, straps, solder, tabs, tacks, ties, uniters, or any other structure for attaching a heat sink element to a heat-generating component known in the art.

Accordingly, the term "attach," as used herein, means and includes affix, adhere, assemble, bolt, bond, button, carry, cinch, clamp, clasp, clench, clinch, clip, connect, contact, couple, epoxy, fasten, fit, fix, glue, hang, harness, interconnect, join, latch, lead, link, mount, nail, paste, peg, pin, reaffix, reattach, refasten, refix, resecure, rivet, screw, secure, solder, staple, stick, strap, tab, tack, tie, unite, or other technique or action for attaching a heat sink element to a heat-generating component known in the art.

Figure 1:
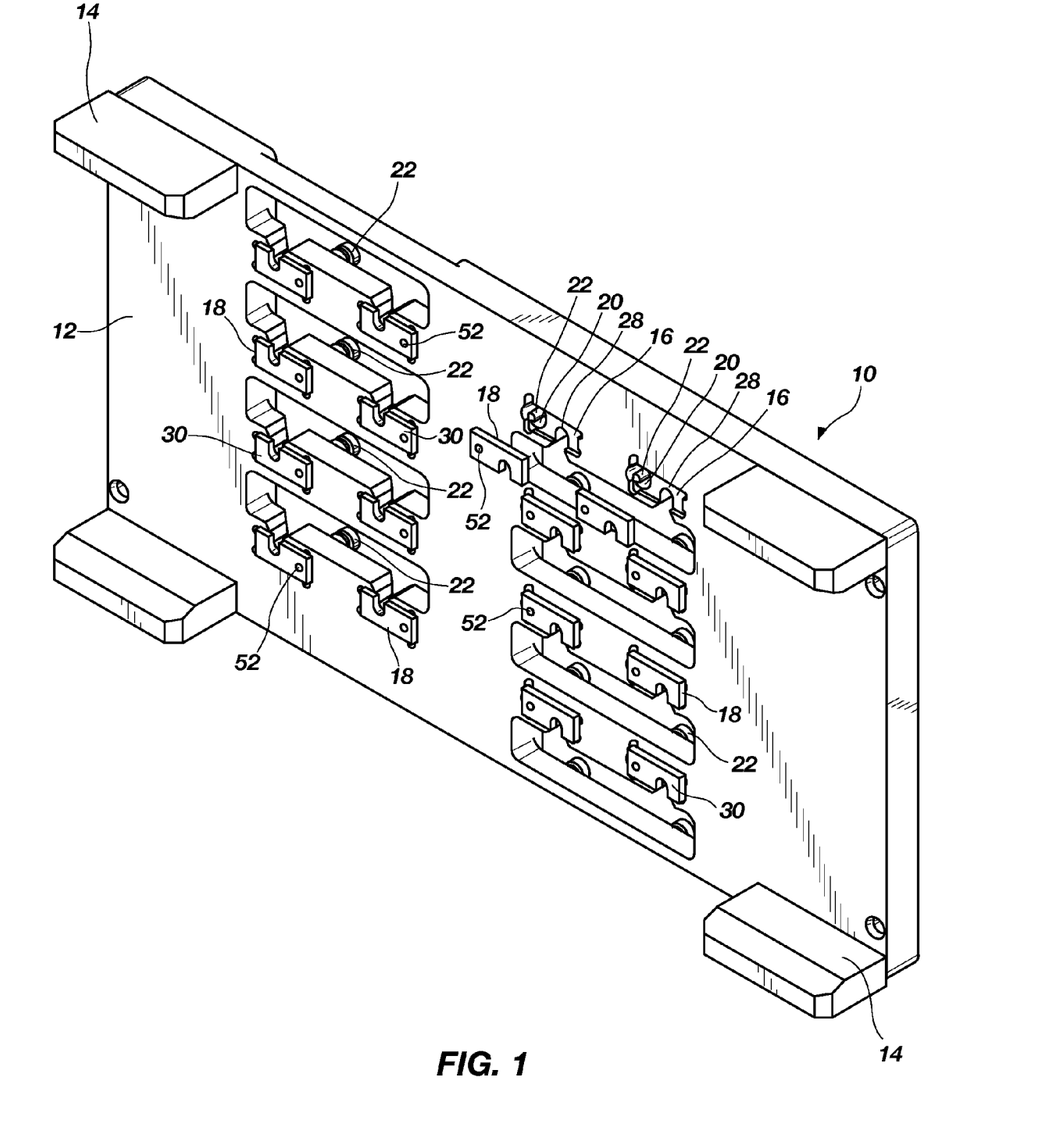
FIG. 1 is a partially exploded perspective view of an assembly fixture and heat sink mounting tabs in accordance with one embodiment of the present disclosure.

FIG. 1 shows a partially exploded perspective view of an assembly fixture 10 according to an embodiment of the present disclosure. The assembly fixture 10 includes an assembly member 12 and a plurality of legs 14 depending from the assembly member 12. The assembly fixture 10 further includes a plurality of recesses 16 formed in a surface of the assembly member 12. Each recess 16 may be of a size and shape configured to receive a mechanical attachment feature, such as, for example, an affixer, an assembler, a bolt, a button, a carrier, a cinch, a clamp, a clasp, a clencher, a clinch, a clip, a connector, a contact, a coupler, a fastener, a fitter, a fixer, a hanger, a harness, an interconnect, a joiner, a latch, a lead, a link, a mount, a nail, a peg, a pin, a reaffixer, a reattachment, a refastener, a refixer, a resecurer, a rivet, a rod, a screw, a securer, a staple, a stick, a strap, a tab, a tack, a tie, a uniter, or, as shown in FIG. 1, a heat sink mounting tab 18 of a plurality of heat sink mounting tabs 18, partially therein such that a heat sink attachment surface 26 (see FIG. 2) of each mounting tab 18 abuts against and is flush with an at least substantially planar assembly surface 28 forming a floor of each recess 16 of the plurality. The assembly surfaces 28 of the recesses 16 are at least substantially coplanar. In other embodiments, the assembly member 12 may not have recesses 16 formed therein, but may comprise a uniform, at least substantially planar surface to which heat sink mounting tabs 18 may be attached.

The assembly fixture 10 and the mounting tabs 18 may be attached using other, releasable attachment features, such as screws. For example, holes 20 may be formed in the assembly fixture 10 and holes 52 may also be formed in the mounting tabs 18, which holes 20 and 52 may be threaded to receive screws 22 therein. In some embodiments, only the holes 52 in the mounting tabs 18 may be threaded, while holes 20 in the assembly fixture 10 are smooth-walled and sized to provide clearance for screws 22 passing therethrough. The screws 22 attach the mounting tabs 18 to the assembly fixture 10, attaching them within the recesses 16 and ensuring that the heat sink attachment surfaces 26 (see FIG. 2) of the mounting tabs 18 abut against and are flush with the at least substantially coplanar assembly surfaces 28 of the recesses 16. The screws 22 may comprise, for example, spring-loaded captive screws 22. In other embodiments, other attachment features may be used to releasably attach the mounting tabs 18 to the assembly fixture 10, such as, for example, clamps, snap-fit mating features, etc.

When the mounting tabs 18 are attached to the assembly fixture 10, heat sink attachment surfaces 26 of the mounting tabs 18 are at least substantially coplanar, such as due to their abutment against an at least substantially planar surface, such as the substantially coplanar assembly surfaces 28 of each recess 16 of the plurality of recesses 16. The mounting tabs 18 may be attached to the assembly fixture 10 in a predetermined configuration. For example, the mounting tabs 18 depicted in FIG. 1 are mounted in recesses 16 forming two arrays, each array comprising eight mounting tabs 18 in four rows and two columns. In other embodiments, any number of mounting tabs 18 may be attached to the assembly fixture 10 in any desired configuration. The recesses 16 formed in the assembly fixture 10 may also be configured to orient the mounting tabs 18 in a desired manner. For example, the recesses 16 depicted in FIG. 1 are formed such that, when the mounting tabs 18 are attached to the assembly fixture 10, the mounting tabs 18 are at least partially disposed within the recesses 16, and movement of the mounting tabs 18 is at least substantially restrained in all directions. In other words, the sidewalls of the recesses 16 shown in FIG. 1 substantially prevent rotation or other displacement of the mounting tabs 18 in the plane of the assembly fixture 10, while spring-loaded captive screws 22 attach the mounting tabs 18 to the assembly member 12 of the assembly fixture 10. The arrangement of the mounting tabs 18 may correspond to an arrangement of heat-generating components 24 (see FIG. 2) to which the mounting tabs 18 attach.

Though the mounting tabs 18 shown in FIG. 1 are depicted as being of substantially rectangular shape, having a length, width and depth, the mounting tabs 18 may be of any suitable shape or size for cooperative attachment to heat-generating components 24 (see FIG. 2) and for cooperative receipt with recesses 16 to substantially prevent movement therein. For example, the mounting tabs 18 may have a predetermined size and shape to optimize dissipation of heat from a given type of heat-generating component. In the embodiment shown in FIG. 1, where the mounting tabs 18 comprise a three-dimensional, substantially rectangular peripheral shape, the mounting tabs 18 may have a length of about 20 millimeters, a width of about 9 millimeters, and a depth of about 3 millimeters. The shape, length, width, and depth of the mounting tabs 18, however, may be designed and manufactured to be any suitable shape or size to enable the mounting tabs 18 to attach to an assembly fixture 10, to attach to heat-generating components 24 (see FIG. 2), and to transfer heat from the heat-generating components 24. Optimal shape and size of the mounting tabs 18 may depend on, for example, the size and shape of the heat-generating components 24 and the wattage or power rating of the heat-generating components 24. The mounting tabs 18 may also comprise a thermally conductive material to facilitate heat dissipation. For example, the mounting tabs 18 may comprise aluminum, gold, copper, silver, indium, tin, alloys of these, a thermally conductive composite material, or any combination of these. Specifically, the mounting tabs 18 may comprise tin-plated copper, which may increase the wettability or solderability of the mounting tabs 18.

Figure 2:
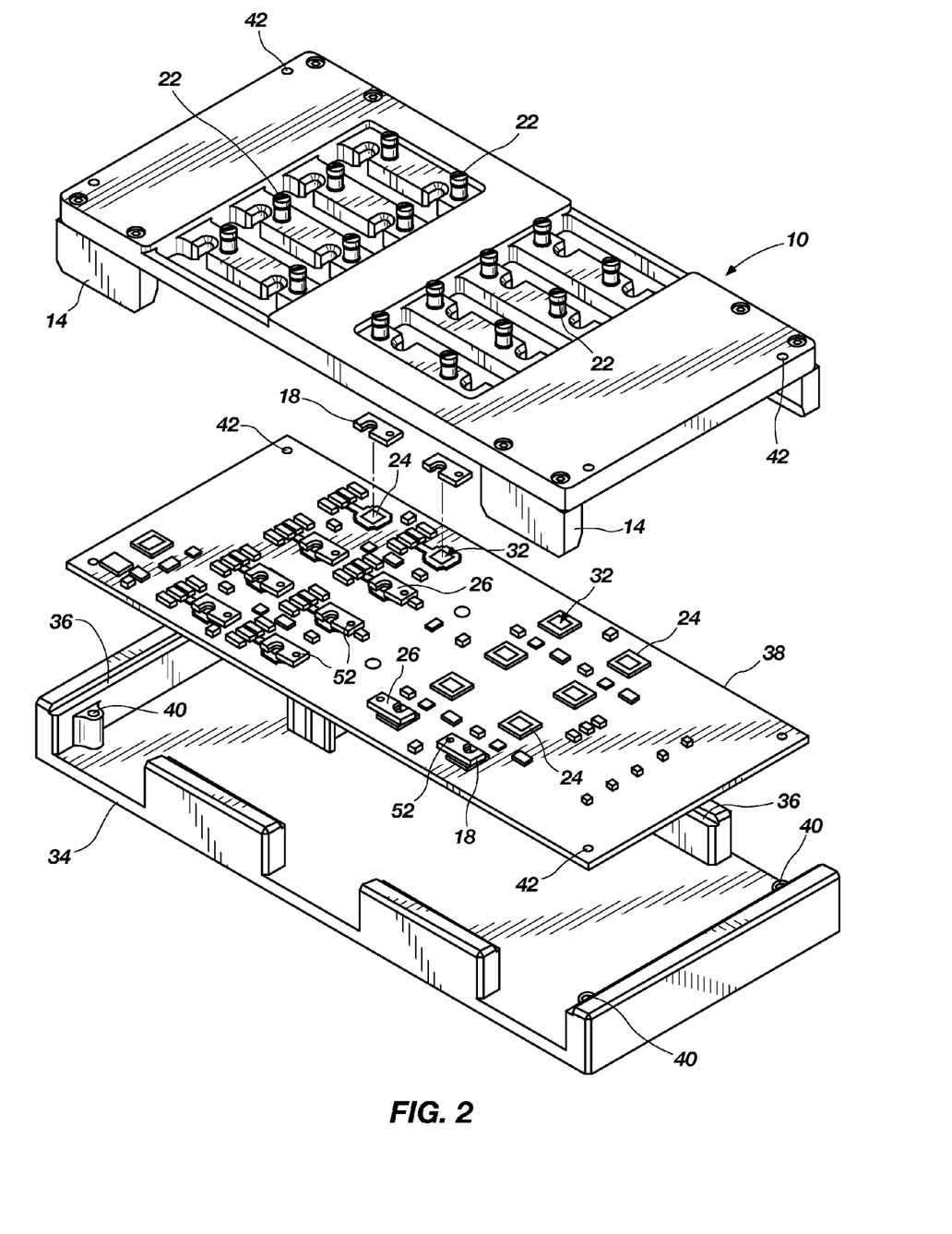
FIG. 2 is a partially exploded perspective view of the assembly fixture and heat sink mounting tabs of FIG. 1, further depicting a method of attaching the heat sink mounting tabs to heat-generating components according to one embodiment of the present disclosure.

FIG. 2 shows a partially exploded view of the assembly fixture 10 and heat sink mounting tabs 18 of FIG. 1, depicting a method of attaching the mounting tabs 18 to heat-generating components 24 according to an embodiment of the present disclosure. Once the mounting tabs 18 are attached to the assembly fixture 10 such that heat sink attachment surfaces 26 are at least substantially coplanar, the assembly fixture 10 and at least some of the mounting tabs 18 may be provided over a like plurality of heat-generating components 24 attached to a common substrate. For example, the heat-generating components shown in FIG. 2 may be provided on a substrate, for example, on a printed circuit board 38. Mounting tab 18 component attachment surfaces 30 (see FIG. 1) opposing the heat sink attachment surfaces 26 may be brought proximate to upper surfaces 32 of the heat-generating components 24, and aligned therewith. The upper surfaces 32 of the heat-generating components 24 are not necessarily coplanar. For example, the upper surfaces 32 of heat-generating components 24 may have a difference in height of up to about one millimeter (1 mm). In some embodiments, at least one mounting tab 18 component attachment surface 30 (see FIG. 1) may contact and abut the upper surface 32 of the tallest heat-generating component 24, while a space (e.g., a gap) may remain between the remaining mounting tabs 18 and heat-generating components 24. In other embodiments, a space may be present between each mounting tab 18 and each corresponding heat-generating component 24. The allowable space may depend on the thermal impedance of the attachment medium. Thus, an attachment medium with a low thermal impedance, such as, for example, an impedance of about fifty Watts per meter (50 W/m) may enable attachment of a mounting tab 18 to a heat-generating component 24 across a relatively large space. For example, a mounting tab 18 and a corresponding heat-generating component 24 may be up to one millimeter (1 mm) apart.

In addition to the assembly fixture 10, a cooperative assembly fixture base 34 may also be provided. The assembly fixture base 34 may include various features to facilitate accurate alignment and attachment of the mounting tabs 18 to the heat-generating components 24. For example, the assembly fixture base 34 may include a ledge 36 proximate the perimeter of the assembly fixture base 34. The ledge 36 may be configured such that a portion of the printed circuit board 38, a portion of the assembly fixture 10, or a portion of each may abut against and rest on the ledge 36 during the assembly process. The assembly fixture base 34 may also include holes 40. Cooperating holes 42 may be formed in the assembly fixture 10 and in the printed circuit board 38, to facilitate attachment to the assembly fixture base 34. For example, the holes 40 in the assembly fixture base 34 may be threaded, and the holes 42 formed in the assembly fixture 10 may permit clearance of a screw (not shown) extended therethrough to attach the assembly fixture 10 to the assembly fixture base 34. In other embodiments, the holes 40 in the assembly fixture base 34 may not be threaded, and a rod or peg, for example, may be inserted through the holes 40, 42 to facilitate alignment of the assembly fixture 10 and the printed circuit board 38 with the assembly fixture base 34. In addition, the legs 14 depending from the assembly member 12 may have a selected height such that, when the legs 14 are brought into contact with the assembly fixture base 34, the mounting tabs 18 are vertically proximate the heat-generating components 24. For example, when the legs 14 contact the assembly fixture base 34, the upper surface 32 of the tallest heat-generating component 24 may abut a corresponding mounting tab 18. The weight of the assembly fixture 10 may hold at least one mounting tab 18 against the tallest of the heat-generating components 24.

Once the mounting tabs 18 are aligned with the heat-generating components 24, the mounting tabs 18 may be attached to the heat-generating components 24. Attaching the mounting tabs 18 to the heat-generating components 24 may comprise thermally and mechanically attaching the mounting tabs 18 to the heat-generating components 24. For example, a solder may be provided on upper surfaces 32 of heat-generating components 24 and/or on the component attachment surfaces 30 of mounting tabs 18 to attach the mounting tabs 18 to the heat-generating components 24 and to at least substantially fill any gaps therebetween using, for example, conventional soldering techniques. A suitable, relatively low-temperature solder may be selected so as to not damage the heat-generating components or substantially impact the thermal budgets of the various heat-generating components. For example, a eutectic solder, such as a solder comprising sixty-three percent (63%) tin and thirty-seven percent (37%) lead, may be selected. In embodiments where the mounting tabs 18 are soldered to the heat-generating components 24, the assembly member 12 may comprise a thermally stable, insulating material to enable sufficient heating of the solder. In other embodiments, the mounting tabs 18 may be attached to the heat-generating components 24 using a thermally activated epoxy, screws, rivets, or other suitable attachment feature.

The mounting tabs 18 may be arranged in a manner corresponding to the heat-generating components 24 provided on the printed circuit board 38. In the embodiment shown in FIG. 2, both the heat-generating components 24 and the mounting tabs 18 are configured in two arrays comprising two columns and four rows. In other embodiments, any desirable configuration of heat-generating components 24 and corresponding mounting tabs 18 may be used. As shown in FIG. 2, some heat-generating components 24 may not have mounting tabs 18 attached thereto. In other embodiments, each heat-generating component 24 may be attached to a corresponding mounting tab 18.

After the mounting tabs 18 are attached to the heat-generating components 24, the spring-loaded captive screws 22 may be removed. The assembly fixture 10 and assembly fixture base 34 may also be removed, leaving the mounting tabs 18 attached to the heat-generating components 24. Due to prior attachment of the mounting tabs 18 to the at least substantially coplanar assembly surfaces 28, the heat sink attachment surfaces 26 of the mounting tabs 18 may be at least substantially coplanar. For example, the heat sink attachment surfaces 26 of the mounting tabs 18 may be a maximum of thirteen-hundredths of a millimeter (0.13 mm) out of plane with one another. Stated another way, the heat sink attachment surfaces 26 of the mounting tabs 18 may be coplanar with a tolerance of, for example, plus or minus about thirteen-hundredths of a millimeter (±0.13 mm). When a heat sink 44 (see FIG. 3) is attached to a group of mounting tabs 18, as further described hereinbelow, the force or stress condition on the heat-generating components 24 may be zero or at least substantially near zero because the heat sink attachment surfaces 26 of the mounting tabs 18 are at least substantially coplanar.

Figure 3:
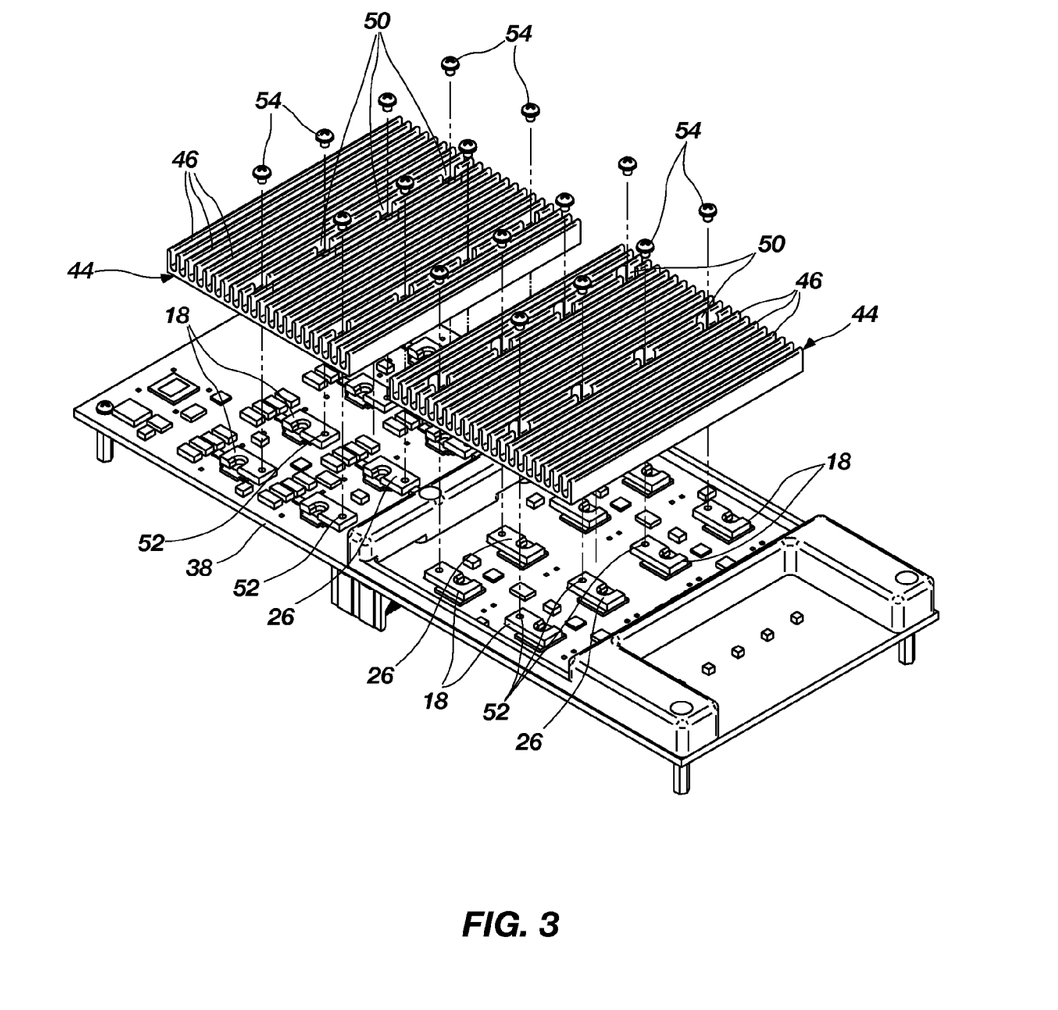
FIG. 3 is a partially exploded perspective view of a plurality of heat sinks depicting a method of attaching the plurality of heat sinks to mounting tabs in accordance with one embodiment of the present disclosure.

FIG. 3 is a partially exploded perspective view of a plurality of heat sinks 44 depicting a method of attaching the heat sinks 44 to groups of mounting tabs 18 in accordance with one embodiment of the present disclosure. Heat sinks 44, which may also be characterized as heat sink elements as such structures may also perform one or more functions in addition to heat transfer, may be brought proximate the mounting tabs 18 in superimposition thereover. Each heat sink 44 is configured for attachment to at least some of a plurality of heat sink mounting tabs 18. In addition, the heat sinks 44 are configured to dissipate heat from the heat-generating components 24. The heat sinks 44 may enable sharing of thermal mass from a location of one heat-generating component 24 with locations of other heat-generating components 24. For example, the heat sinks 44 shown in FIG. 3 are monolithic-style heat sinks 44 having a plurality of laterally separated, vertically protruding fins 46 configured to dissipate heat. The fins 46, however, may be of any size, shape, or arrangement suitable to dissipate heat from the heat-generating components 24. In other embodiments, the heat sinks 44 may not be monolithic-style heat sinks 44, but may have any profile, configuration, or structure desirable to dissipate heat from the heat-generating components 24, either through natural radiation and convection, or in combination with forced ventilation. For example, heat sinks 44 may include channels or bores therethrough, through which cooling air or other fluid may pass or be forced through. The heat sinks 44 may also comprise a thermally conductive material to facilitate heat dissipation. For example, the heat sinks 44 may comprise aluminum, gold, copper, silver, indium, alloys of these, a thermally conductive composite material, or any combination of these.

The heat sinks 44 each include a mounting tab attachment surface 48 (see FIG. 4) of sufficient size and shape to attach to at least two mounting tabs 18. The heat sinks 44 further include structures for attachment to the mounting tabs 18. For example, the heat sinks 44 shown in FIG. 3 each include a plurality of holes 50 formed therein and arranged in a manner corresponding to at least some of the heat sink attachment surfaces 26 of the mounting tabs 18. Likewise, the mounting tabs 18 include threaded holes 52 that are axially aligned with the holes 50 in the heat sinks 44. Attachment features, such as screws 54, may be inserted through the holes 50 in the heat sinks 44 and engage the threaded holes 52 to attach the heat sinks 44 to at least some of the mounting tabs 18. The screws 54 may be used to form a thermal and mechanical attachment between the heat sinks 44 and the mounting tabs 18. In other embodiments, the heat sinks 44 may be attached to the mounting tabs 18 using a soldered connection, a thermal epoxy, a rivet, or any other suitable attachment feature. Heat sinks 44 may be thermally attached to, but not necessarily mechanically attached to, each mounting tab 18. In summary, heat may be dissipated from the heat-generating components 24 by providing a continuous, effective thermal attachment from the heat-generating components 24 to the heat sinks 44 using mounting tabs 18 and the attachment features between each of these structures.

Though the heat sinks 44 depicted in FIG. 3 are each configured to attach to eight mounting tabs 18 on two sections of a printed circuit board 38, persons of ordinary skill in the art will understand that embodiments of heat sinks 44 in accordance with the present disclosure may be configured to attach to any desirable number of mounting tabs 18. Moreover, in some embodiments, a single heat sink 44 may be configured to attach to every mounting tab 18 of each heat-generating component 24 provided on a printed circuit board 38. In other embodiments, a heat sink 44 may be configured to attach to a first plurality of mounting tabs of a first plurality of heat-generating components provided on a first printed circuit board or other substrate and a second plurality of mounting tabs of a second plurality of heat-generating components provided on a second printed circuit board or other substrate. In this way, multiple substrates bearing heat-generating components 24 may be thermally and mechanically attached together using a single heat sink 44 or multiple heat sinks 44. Though the two sets of eight mounting tabs 18 shown in FIG. 3 are at least substantially coplanar, different sets of mounting tabs 18 may have upper surfaces in different planes at different heights, and a single heat sink 44 may be attached to each set of mounting tabs 18 having coplanar upper surfaces at each different height.

Figure 4:
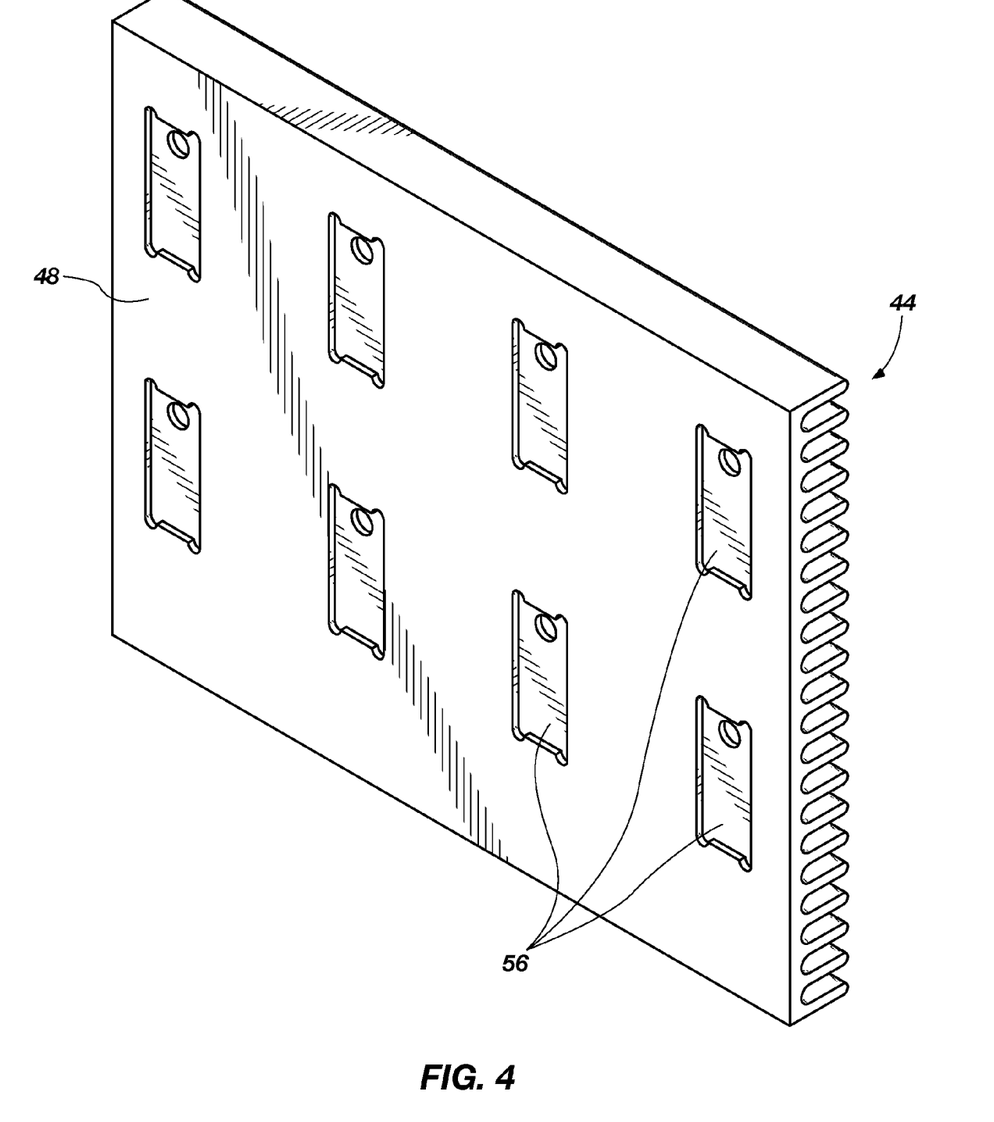
FIG. 4 is a perspective view of a heat sink in accordance with an embodiment of the present disclosure.

The heat sinks 44 may also include a plurality of recesses 56 formed in a surface 48, as shown in FIG. 4. Like the recesses 16 that may be formed in the assembly fixture 10 (see FIG. 1), the recesses 56 formed in the heat sinks 44 may be configured to receive the mounting tabs 18 at least partially therein. The recesses 56 may be configured to facilitate attachment of the heat sinks 44 to the mounting tabs 18. For example, the recesses 56 may be at least one of a size, shape, and arrangement configured to enable the mounting tabs 18 to at least partially enter the recesses 56 only when the recesses 56 and the mounting tabs 18 are mutually aligned to enable attachment of the mounting tabs 18 to the heat sink 44. Once the mounting tabs 18 are aligned with and at least partially disposed in the recesses 56, the mounting tabs 18 may be attached to the heat sink 44 in any of the previously described ways. In other embodiments, however, the heat sink 44 may not include recesses 56 formed therein. In such embodiments, the mounting tabs 18 may be attached directly to a planar surface 48 of the heat sinks 44. In still further embodiments, a heat sink 44 may include a plurality of frames projecting from an underside thereof, each frame sized and shaped to define a recess 56 to at least partially receive a mounting tab 18 therein.

Figure 5:
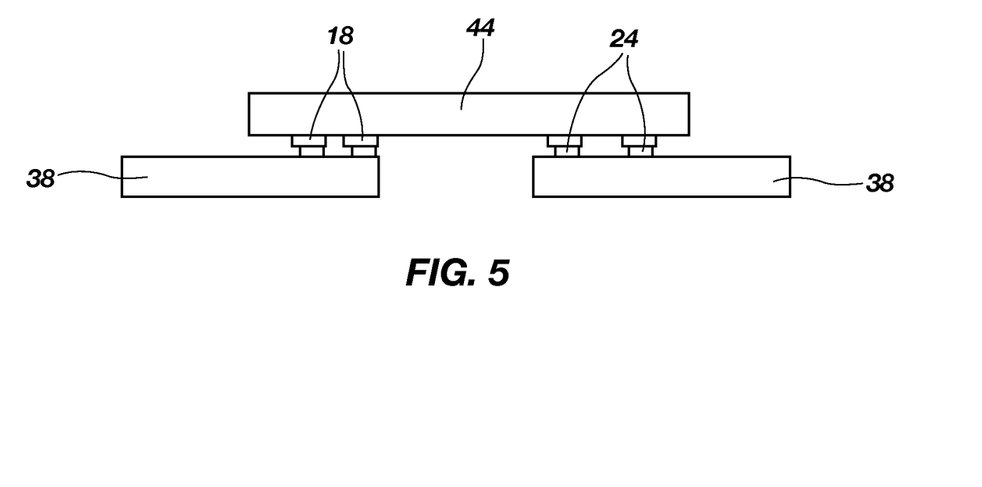
FIG. 5 is a schematic view of a heat sink attached to multiple substrates in accordance with an embodiment of the present disclosure.

FIG. 5 is a schematic view of a heat sink 44 attached to heat-generating components 24 disposed on multiple, laterally offset printed circuit boards 38 or other substrates. The heat sink 44 is attached to the heat-generating components 24 using mounting tabs 18. In this way, multiple printed circuit boards 38, or other substrates, may be thermally and mechanically attached together using a single heat sink 44. In other embodiments, multiple heat sinks 44 may be used to attach multiple printed circuit boards 38 thermally and mechanically to one another. When attached to multiple printed circuit boards 38, the heat sink 44 may enable sharing of thermal mass between multiple printed circuit boards 38, or other substrates.

Figure 6:
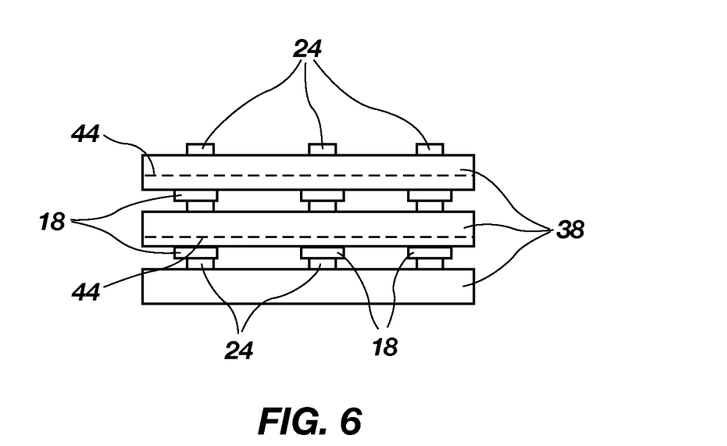
FIG. 6 is a schematic view of stacked substrates in a mezzanine configuration in accordance with an embodiment of the present disclosure.

Referring to FIG. 6, a schematic view of stacked substrates 38 in a mezzanine configuration is shown. Each substrate 38 has a plurality of components 24 provided thereon. The substrates 38 may be attached to one another in a stacked mezzanine configuration using mounting tabs 18, or other suitable attachment features, having substantially coplanar attachment surfaces. The stacked substrates 38 may be in complete vertical superimposition as depicted, or comprise a partially offset, so-called "shingle stack." Moreover, different-sized substrates 38 may be superimposed and two or more laterally offset, smaller substrates 38 may be secured to a larger substrate 38. The mounting tabs 18 may provide thermal and mechanical attachment of one substrate 38 to another substrate 38 while enabling simple disassembly and reassembly of the stacked substrates 38 for repairs, service, and cleaning. In some embodiments, a heat sink 44, such as a metal heat sink plane as shown in broken lines, may be embedded within, or attached to an underside of some or all of substrates 38. Attachment of multiple substrates 38 bearing heat generating components 24 using attachment features such as mounting tabs 18 may enable increased potential power of electronic systems while providing adequate cooling and simple disassembly and reassembly.

CONCLUSION

In some embodiments, the present disclosure includes assemblies comprising a plurality of components provided on a substrate and a plurality of attachment features. Each attachment feature comprises a component surface and a heat sink surface. The component surface of each attachment feature of the plurality is attached to a component of the plurality of components, and the heat sink surfaces of the plurality of attachment features are at least substantially coplanar. A heat sink element is attached to the plurality of attachment features at the heat sink surface of at least some attachment features of the plurality.

In additional embodiments, the present disclosure includes an assembly, comprising a first plurality of heat-generating components and at least a second plurality of heat-generating components. A first plurality of attachment features is thermally and mechanically attached to the first plurality of heat-generating components and at least a second plurality of attachment features is thermally and mechanically attached to the at least a second plurality of heat-generating components. Heat sink surfaces of attachment features of the first plurality are at least substantially coplanar and heat sink surfaces of attachment features of the at least a second plurality are at least substantially coplanar. A first heat sink element is attached to at least some of the first plurality of attachment features at the heat sink surfaces of attachment features of the first plurality. At least another heat sink element is attached to at least some of the at least a second plurality of attachment features at the heat sink surfaces of attachment features of the at least a second plurality.

In further embodiments, the present disclosure includes assemblies, wherein at least two substrates, one or more of which may comprise a circuit board, are placed in vertical superimposition and mechanically and thermally attached using the aforementioned techniques.

In further embodiments, the present disclosure includes methods of assembling, comprising attaching a plurality of first attachment features to at least one substantially planar assembly surface of an assembly fixture such that heat sink surfaces of the plurality of attachment features are substantially coplanar. At least some of the plurality of attachment features attached to the assembly fixture are aligned with a like plurality of heat-generating components. The at least some of the plurality of attachment features are attached to the plurality of heat-generating components. The assembly fixture is removed from the plurality of attachment features, and a heat sink element is attached to at least some of the attachment features of the plurality.

In some embodiments, heat-dissipating assemblies comprise heat-generating electrical components. Mounting tabs may be attached to the heat-generating electrical components. Each mounting tab may comprise a first surface and an opposing second surface. The first surface of each mounting tab may be attached to a respective heat-generating electrical component. The second surface of each mounting tab may be at least substantially coplanar with the second surfaces of the other mounting tabs. A heat sink element may abut the second surfaces of the mounting tabs and may be attached to at least some of the mounting tabs at the second surfaces of the at least some of the mounting tabs.

In other embodiments, heat-dissipating assemblies comprise a first group of heat-generating electrical components and a second group of heat-generating electrical components. A first group of mounting tabs may be thermally and mechanically attached to the first group of heat-generating electrical components at first surfaces of the first group of mounting tabs. A second group of mounting tabs may be thermally and mechanically attached to the second group of heat-generating electrical components at first surfaces of the second group of mounting tabs. A second surface opposing the first surface of each mounting tab of the first group is at least substantially coplanar with a second surface opposing the first surface of each mounting tab of the second group. A first heat sink element may abut the second surfaces of the mounting tabs of the first group and may be attached to at least some mounting tabs of the first group at the second surfaces of the at least some mounting tabs, and a second heat sink element may abut the second surfaces of the mounting tabs of the second group and may be attached to at least some mounting tabs of the second group at the second surfaces of the at least some mounting tabs.

In still other embodiments, methods of assembling heat-dissipating assemblies comprise attaching mounting tabs to at least substantially planar assembly surfaces of an assembly fixture at first surfaces of the mounting tabs such that the first surfaces of the mounting tabs are at least substantially coplanar with one another. The mounting tabs may be aligned with heat-generating electrical components and the mounting tabs may be attached to the heat-generating electrical components at opposing second surfaces of the mounting tabs. The assembly fixture may be removed from the mounting tabs. A heat sink element may be attached to at least some of the mounting tabs at the at least substantially coplanar first surfaces of the at least some of the mounting tabs.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention encompasses all modifications, variations, and alternatives falling within the scope of the invention as defined by the following appended claims and their legal equivalents.

What is claimed is:

1. A heat-dissipating assembly, comprising:
   heat-generating electrical components;
   mounting tabs, each mounting tab comprising a first surface and an opposing second surface, the first surface of each mounting tab being attached to a respective heat-generating electrical component, the second surface of each mounting tab being at least substantially coplanar with the second surfaces of each other mounting tab; and
   a heat sink element abutting the second surfaces of the mounting tabs and attached to at least some of the mounting tabs at the second surfaces of the at least some of the mounting tabs.

2. The heat-dissipating assembly of claim 1, wherein the second surface of each mounting tab is within thirteen-hundredths of a millimeter of being coplanar with the second surfaces of the each other mounting tab.

3. The heat-dissipating assembly of claim 1, wherein the heat sink element comprises a heat sink.

4. The heat-dissipating assembly of claim 1, wherein at least one of the heat-generating electrical components comprises an integrated circuit device.

5. The heat-dissipating assembly of claim 1, wherein each mounting tab comprises a thermally conductive material.

6. The heat-dissipating assembly of claim 5, wherein the thermally conductive material comprises one of copper, indium, and an alloy comprising at least one of copper and indium.

7. The heat-dissipating assembly of claim 1, wherein the second surfaces of the at least some of the mounting tabs are attached to the heat sink element using at least one of a soldered connection, a thermal epoxy, a screw, and a rivet.

8. The heat-dissipating assembly of claim 1, wherein the heat sink element comprises recesses, each recess configured to receive a respective mounting tab at least partially therein.

9. A heat-dissipating assembly, comprising:
   a first group of heat-generating electrical components;
   a second group of heat-generating electrical components;
   a first group of mounting tabs thermally and mechanically attached to the first group of heat-generating electrical components at first surfaces of the first group of mounting tabs;
   a second group of mounting tabs thermally and mechanically attached to the second group of heat-generating electrical components at first surfaces of the second group of mounting tabs; wherein a second surface opposing the first surface of each mounting tab of the first group is at least substantially coplanar with a second surface opposing the first surface of each mounting tab of the second group; and
   a first heat sink element abutting the second surfaces of the mounting tabs of the first group and attached to at least some mounting tabs of the first group at the second surfaces of the at least some mounting tabs and a second heat sink element abutting the second surfaces of the mounting tabs of the second group and attached to at least some mounting tabs of the second group at the second surfaces of the at least some mounting tabs.

10. The heat-dissipating assembly of claim 9, wherein the second surface of each mounting tab of the first group is within thirteen-hundredths of a millimeter of being coplanar with the second surface of each mounting tab of the second group.

11. The heat-dissipating assembly of claim 9, wherein at least one heat-generating electrical component of the first group and at least one heat-generating component of the second group comprise integrated circuit devices.

12. The heat-dissipating assembly of claim 9, wherein the first group of heat-generating electrical components and the second group of heat-generating electrical components are located on a common circuit board.

13. The heat-dissipating assembly of claim 9, wherein the second surfaces of the at least some mounting tabs of the first group are thermally and mechanically attached to the first heat sink element and the second surfaces of the at least some mounting tabs of the second group are thermally and mechanically attached to the second heat sink element using at least one of a soldered connection, a thermal epoxy, a screw, and a rivet.

14. The heat-dissipating assembly of claim 9, wherein each mounting tab of the first group and each mounting tab of the second group comprises a conductive material selected from the group consisting of copper, indium, and an alloy comprising at least one of copper and indium.

15. The heat-dissipating assembly of claim 9, wherein at least one of the first heat sink element and the second heat sink element comprises recesses, each recess configured to receive a respective mounting tab at least partially therein.

16. A method of assembling a heat-dissipating assembly, comprising:
attaching mounting tabs to at least substantially planar assembly surfaces of an assembly fixture at first surfaces of the mounting tabs such that the first surfaces of the mounting tabs are at least substantially coplanar with one another;
aligning the mounting tabs with heat-generating electrical components;
attaching the mounting tabs to the heat-generating electrical components at opposing second surfaces of the mounting tabs;
removing the assembly fixture from the mounting tabs; and
attaching a heat sink element to at least some of the mounting tabs at the at least substantially coplanar first surfaces of the at least some of the mounting tabs.

17. The method of assembling the heat-dissipating assembly of claim 16, wherein attaching the mounting tabs to the at least substantially planar assembly surfaces of the assembly fixture such that the first surfaces of the mounting tabs are at least substantially coplanar with one another comprises attaching mounting tabs to the at least substantially planar assembly surfaces of the assembly fixture such that the first surfaces of the mounting tabs are within thirteen-hundredths of a millimeter of being coplanar with one another.

18. The method of assembling the heat-dissipating assembly of claim 16, wherein attaching the mounting tabs to the at least substantially planar assembly surfaces of the assembly fixture comprises attaching the mounting tabs to the at least substantially planar assembly surfaces of the assembly fixture using spring-loaded captive screws.

19. The method of assembling the heat-dissipating assembly of claim 16, wherein attaching the mounting tabs to the at least substantially planar assembly surfaces of the assembly fixture comprises attaching the mounting tabs at least partially within recesses formed in the assembly fixture.

20. The method of assembling the heat-dissipating assembly of claim 16, wherein attaching the heat sink element to the at least some of the mounting tabs comprises at least one of soldering, attaching with thermal epoxy, screwing, or riveting the at least some of the mounting tabs to the heat sink element.

* * * * *